(12) United States Patent
Furukawa

(10) Patent No.: US 6,756,568 B1
(45) Date of Patent: Jun. 29, 2004

(54) HOT PLATE UNIT

(75) Inventor: Masakazu Furukawa, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 10/048,894

(22) PCT Filed: Jun. 2, 2000

(86) PCT No.: PCT/JP00/03595

§ 371 (c)(1),
(2), (4) Date: Feb. 1, 2002

(87) PCT Pub. No.: WO01/95379

PCT Pub. Date: Dec. 13, 2001

(51) Int. Cl.[7] ............................................. H05B 3/68
(52) U.S. Cl. ...................... 219/444.1; 219/548
(58) Field of Search .................. 219/444.1, 465.1, 219/466.1, 543, 544, 548; 118/724, 755; 338/307, 308, 309

(56) References Cited

U.S. PATENT DOCUMENTS

| | | | | |
|---|---|---|---|---|
| 2,976,386 A | * | 3/1961 | Salton | 219/450.1 |
| 3,805,024 A | * | 4/1974 | Joeckel et al. | 219/553 |
| 3,987,275 A | * | 10/1976 | Hurko | 219/451.1 |
| 4,717,810 A | * | 1/1988 | Schreder | 219/461.1 |
| 4,960,978 A | * | 10/1990 | Lorenz et al. | 219/448.17 |
| 5,374,807 A | * | 12/1994 | Yahav et al. | 219/466.1 |
| 5,462,603 A |   | 10/1995 | Murakami | |
| 5,643,483 A |   | 7/1997 | Kubota et al. | |
| 6,043,460 A |   | 3/2000 | Johnsgard et al. | |
| 6,448,538 B1 | * | 9/2002 | Miyata | 219/444.1 |

FOREIGN PATENT DOCUMENTS

| | | |
|---|---|---|
| EP | 0658726 | 6/1995 |
| GB | 2282825 | 4/1995 |
| JP | 62-96292 | 6/1987 |
| JP | 63274768 | 11/1988 |
| JP | 6053145 | 2/1994 |
| JP | 8176831 | 7/1996 |
| JP | 8222360 | 8/1996 |
| JP | 8274147 | 10/1996 |
| JP | 9082786 | 3/1997 |
| JP | 9148315 | 6/1997 |
| JP | 11-283729 | 10/1999 |

* cited by examiner

*Primary Examiner*—Sang Paik
(74) *Attorney, Agent, or Firm*—Cherskov & Flaynik

(57) ABSTRACT

A hot plate unit (1) having a reduced heater temperature rise time and not generating dusts. The hot plate unit comprises a casing (2) having an opening portion; a heater (3) arranged on the opening portion and including a plate-shaped member (9) made from ceramics and a heat generating element (10) arranged on the plate-shaped member; and a radiant heat reflecting member (4) interposed between the casing and the heater.

19 Claims, 5 Drawing Sheets

HOT PLATE UNIT

BACKGROUND OF THE INVENTION

The present invention relates to a hot plate unit having a casing and a heater.

In a semiconductor production process, there is performed a step in which a photosensitive resin is formed as an etching resist on a silicon wafer, and this silicon wafer is then etched by using an etchant. The application of the photosensitive resin onto the silicon wafer is carried out by using a coating apparatus such as a spin coater. In this case, since the applied photosensitive resin is in a liquid and unhardened state, a drying step is first performed to lower the fluidity of the resin to some extent, and the resin is then subjected to an exposure/development step.

As an apparatus for drying the silicon wafer, which has undergone the coating step, a hot plate unit, which employs a metal heater comprising an aluminum plate having the back surface on which a heating element is arranged, has been used. However, in the prior art hot plate unit, the metal heater must inevitably be thicken to prevent the generation of distortion due to thermal expansion, and hence, it is poor in point of temperature control.

Moreover, when the heater is heated, the casing is heated owing to radiant heat generated from the back surface of the heater, resulting in the rise of the temperature of the casing. That is, thermal energy which should inherently be used for heating the heater is partially used to heat the casing, resulting in the loss of the thermal energy. This increases a time required for increasing the heater temperature up to a predetermined temperature, which prolongs a time for the entire drying step, whereby the improvement of productivity tends to be disturbed. In addition, the casing is heated up to a temperature exceeding a heat resistance level of a metal material for the casing, which is not preferable.

To solve the aforementioned problem, there can be considered a method for filling a heat insulating material such as a glass fiber between the heater and the casing so as to shut out the radiant heat. This may prevent the excessive temperature rise of the casing, but the heat insulating material generates dusts, deteriorating an ambient environment. Therefore, such an apparatus is not appropriate for a semiconductor production field which requires a highly clean environment.

BRIEF SUMMARY OF THE INVENTION

It is therefore an object of the invention to provide a hot plate unit having a reduced heater temperature rise time and not generating dusts.

To solve the aforementioned problems, a first aspect of the present invention provides a hot plate unit comprising a casing having an opening portion; a heater arranged on the opening portion and including a plate-shaped member made from ceramics and a heat generating element arranged on the plate-shaped member; and a plate-shaped reflection member interposed between the casing and the heater.

The plate-shaped reflection member is preferably at least one selected from a group consisting of a metal plate, a ceramic plate and a resin plate.

The ceramics are preferably nitride ceramics or carbide ceramics.

The plate-shaped reflection member is preferably arranged via a predetermined distance from the back surface of the heater and in parallel to the back surface.

The plate-shaped reflection member preferably comprises a plurality of plate-shaped members.

The plate-shaped reflection member preferably has reflection planes on both the sides thereof, respectively.

The plate-shaped reflection member preferably comprises a layer reflection member formed on an inner wall of the casing.

The plate-shaped reflection member preferably comprises a foil reflection member.

The casing and the heater are preferably arranged via a predetermined distance from each other.

The heater preferably has a plurality of terminal pins electrically connected to the heat generating element, and a plurality of dummy pins which are longer than the terminal pins and which are not concerned in conduction with the heat generating element.

The heater is preferably equipped with a sleeve which receives the terminal pins and has heat resistance and insulating properties.

The plate-shaped member preferably comprises a plurality of plate-shaped members, and at least one heat generating element is interposed between at least one pair of plate-shaped members.

A second aspect of the present invention provides a hot plate unit which comprises a casing having an opening portion; a heater arranged on the opening portion and including a first plate-shaped member made from ceramics and a heat generating element arranged on the first plate-shaped member; and a second plate-shaped member interposed between the casing and the heater.

The second plate-shaped member is preferably at least one selected from a group consisting of a metal plate, a ceramic plate, and a resin plate.

The ceramics are preferably nitride ceramics or carbide ceramics.

DETAILED DESCRIPTION OF THE PREFERRED EMBODIMENTS

A hot plate unit 1 according to a first embodiment of the present invention will now be described with reference to FIGS. 1 to 5.

Figure 1:
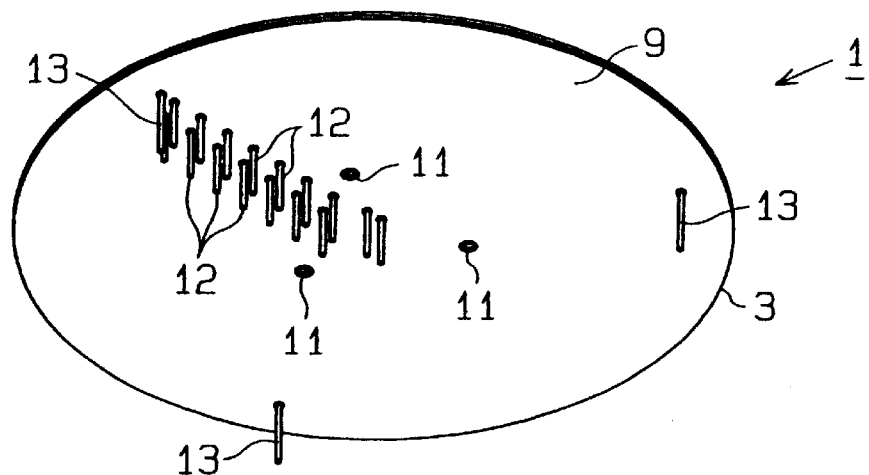
FIG. 1 is an exploded perspective view of a hot plate unit according to a first embodiment of the present invention.
Figure 1:
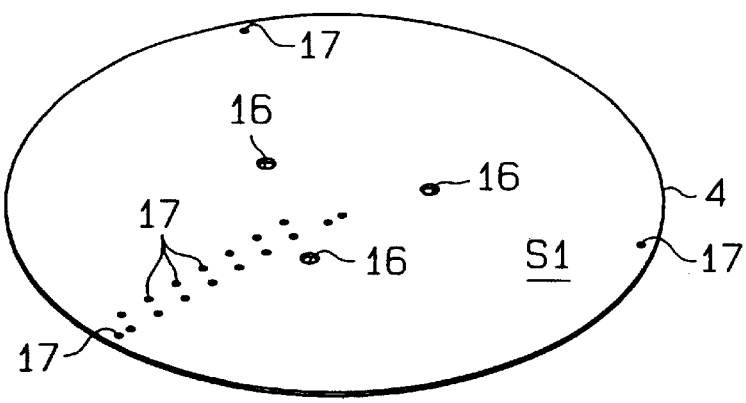
Figure 1:
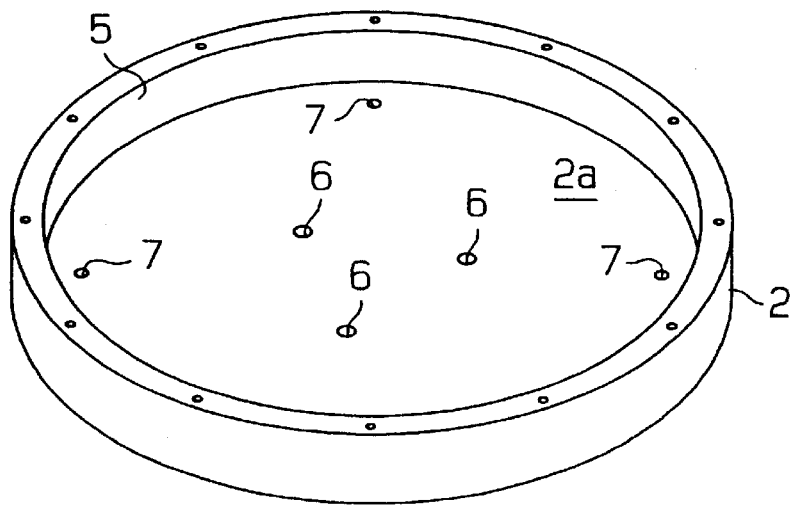

As shown in FIG. 1, the hot plate unit 1 includes a casing 2, a heater 3, and a stainless steel plate 4 as a plate-shaped reflection member.

The casing 2 is a metal (here, aluminum) member having a bottom and has, at its upper portion, an opening portion 5 whose cross section is circular. At a center portion of a bottom portion 2a of the casing 2, three pin insert holes 6 are formed for receiving wafer support pins (not shown). By raising and lowering the wafer support pins inserted in the pin insert holes 6, it is possible to move a wafer to a convey unit or receive the wafer from the convey unit. Moreover, at an outer circumference of the bottom portion 2a, several lead line holes 7 are formed for passing a lead line. Lead lines 8 for supplying current to the heater 3 are inserted into the holes 7.

In the first embodiment, a high-temperature heater 3 is preferably used for drying a silicon wafer (an object to be heated) coated by a photosensitive resin at a high temperature (not lower than 500° C.). This heater 3 is composed of a plate-shaped member 9 formed from ceramics and a heat generating wiring layer 10 as a heat generating object or a heat generating element, and the heater 3 is arranged in the opening portion 5 of the casing 2.

The plate-shaped member 9 constituting the heater 3 is circular whose diameter is designed to be almost identical to the diameter of the opening portion 5 of the casing 2. The plate-shaped member 9 has a layered structure having a plurality of layers. The heat generating wiring layer 10 is interposed between the layers. That is, the heat generating wiring layer 10 is not exposed at all from the upper surface of the heater 3.

More specifically, the ceramic material constituting the plate-shaped member 9 is preferably nitride ceramics or carbide ceramics because of the following reasons. The nitride ceramics and the carbide ceramics have excellent heat resistance, thereby to make a set temperature higher and reduce a time required for raising the temperature up to the set temperature level. Moreover, the nitride ceramics and the carbide ceramics have thermal expansion coefficients smaller than metals, and accordingly, neither warp nor distortion is generated by heating even when the plate has a small thickness. Consequently, these materials are preferable for reducing the thickness and weight of the heater 3. Furthermore, since the nitride ceramics and the carbide ceramics have high thermal conductivity values, the surface temperature of the heater 3 can rapidly follow a temperature change of the heat generating wiring layer 10.

The nitride ceramics are preferably, for example, metal nitride ceramics such as aluminum nitride, silicon nitride, boron nitride, or titanium nitride.

The carbide ceramics are preferably metal carbide such as silicon carbide, zirconium carbide, titanium carbide, tantalum carbide, tungsten carbide, and the like, for example. Among these ceramics, aluminum nitride is particularly preferred because it has the highest thermal conductivity, i.e., 180 W/m·K.

Here, the plate-shaped member constituting the heater 3 has preferably a thickness of 0.5 mm to 5 mm and more preferably approximately 1 mm to 3 mm. When the thickness is too small, the plate-shaped member 9 is easily broken and when the thickness is too large, the hot plate unit may become larger in size and the production cost may be increased, disadvantageously.

As shown in FIG. 1, at a center portion of the heater 3, pin insert holes 11 are formed at three locations corresponding to the pin insert holes 6. Moreover, at the back surface of the heater 3, a plurality of sets of two types of pins (terminal pins 12 and dummy pins 13) are provided.

The terminal pins 12 related to the heat generating wiring layer 10 are arranged in two rows from the center portion toward the outer circumference of the heater 3. Each of these terminal pins 12 has a bottom portion soldered to the land of a through hole 14 formed on the back side of the plate-shaped member 9. As a result, the terminal pins 12 are electrically connected to the heat generating wiring layer 10. It should be noted that the bottom portions of the terminal pins 12 may directly be inserted into and engaged with the through holes 14. The lead line 8 has a metal portion soldered to the tip end of the terminal pins 12. Accordingly, electric current is supplied via the lead line 8 and the terminal pins 12 to the heat generating wiring layer 10 and as a result, the temperature of the heat generating wiring layer 10 is increased to heat the heater 3. It should be noted that the terminal pins 12 should have electric conductivity and accordingly, they are made from a conductive metal material such as Cobal and 42-alloy. In the first embodiment, such a conductive metal material is also used for the dummy pins 13 which do not require electric conductivity.

The dummy pins 13, which are not related to electric conductivity with the heat generating wiring layer 16, are arranged at a plurality of positions of an outer circumference of the heater 3 and not connected to the lead line 8. In the first embodiment, the dummy pins 13 are formed longer than the terminal pins 12. In the first embodiment, each of the dummy pins 13 has a length of 30 mm while each of the terminal pins 12 has a length of 17 mm. Accordingly, when the heater 3 is arranged at the opening 5 of the casing 2, only the tip end of each of the dummy pins is in contact with the outer circumference of the inner surface of the bottom portion 2a of the casing 2. That is, the heater 3 is supported in the horizontal direction by the dummy pins 13. Here, it is preferable that a certain vacant space 15 be assured between the outer circumference of the back side of the heater 3 and the upper surface of the opening 5 of the casing 2. Thus, when the heater 3 is arranged in such a non-contact state, it is possible to prevent increase of the temperature of the casing 2 by the heat conduction from the heater 3.

It should be noted that the aforementioned heater 3 may include a thermocouple buried therein, if necessary. In this case, it is possible to control the temperature of the heater 3 by changing a voltage value and a current value according to the temperature of the heater 3 measured by the thermocouple.

Figure 2:
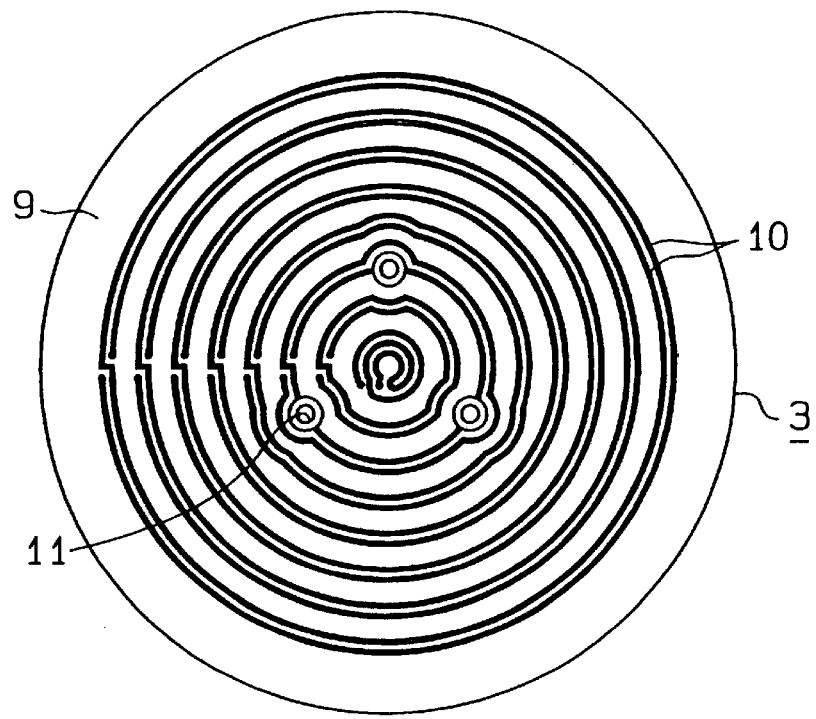
FIG. 2 schematically shows a pattern of a heat generating wiring layer of a heater constituting the hot plate unit.

As schematically shown in FIG. 2, in the heater 3, the heat generating wiring layer 10 formed between the layers are patterned into approximately coaxial circles. This pattern has been employed to uniformly heat the entire region of the heater 3, thereby reducing as much as possible, a temperature difference in the heater 3 as well as a temperature difference of a silicon wafer. The heat generating wiring layer 10 is formed by sintering metal particles contained in a conductive paste.

The heat generating wiring layer 10 preferably has a thickness of 1 $\mu$m to 20 $\mu$m and a width of 0.5 mm to 5 mm. The heat generating wiring layer 10 has a resistance value which can be changed by changing the thickness and the width thereof, and the aforementioned ranges are most practical.

The conductive paste generally used contains a metal particle, a resin, a solvent, and a viscosity-increasing agent.

As a preferable metal particle to be used in the conductive paste, there can be exemplified gold, silver, platinum, palladium, lead, tungsten, nickel, and the like. These metals are not easily oxidized even exposed to a high temperature and has a sufficient resistance value upon heat generation by electric conductance. The metal particle preferably has a diameter in a range of 0.1 $\mu$m to 100 $\mu$m. This is because when the metal particle diameter is too small, oxidization is easily caused. On the contrary, when the particle diameter is too large, sintering cannot be easily performed and the resistance value becomes larger.

As a preferable resin used in the conductive paste, there can be exemplified an epoxy resin and a phenol resin. The solvent may preferably include isopropyl alcohol and the viscosity-increasing agent may preferably include cellulose.

In addition to the metal particles, the conductive paste preferably contains a metal oxide. The reason is that such conductive paste enables accurate adhesion of the plate-shaped member 9 formed from ceramics to the heat generating wiring layer 10 formed from metal, thereby preventing peeling off between the layers.

As the metal oxide, it is preferable to use, for example, lead oxide, zinc oxide, silica, boron oxide ($B_2O_3$), alumina, yttria, titania, and the like. These oxides can improve the adhesion characteristic between the metal and the ceramics without increasing the resistance value of the heat generating member.

Figure 3:
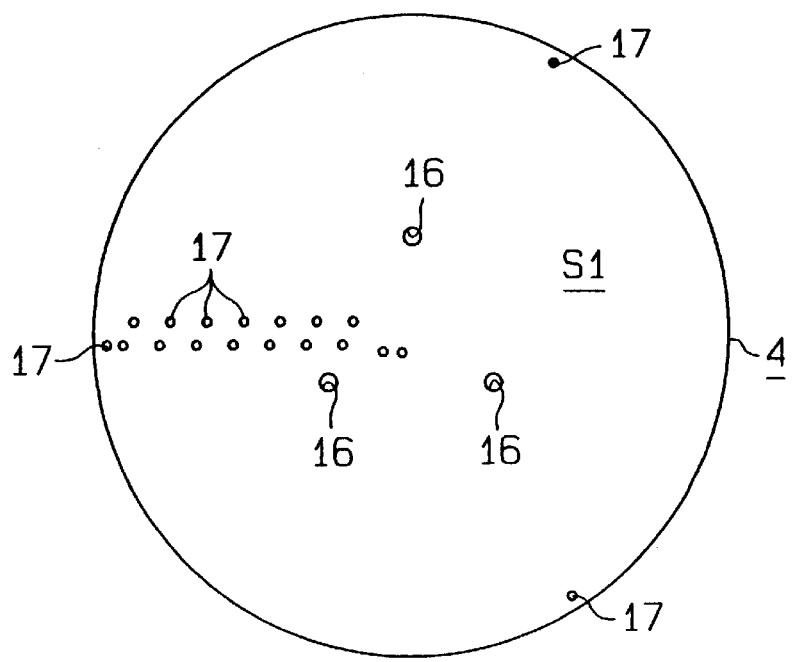
FIG. 3 is a plan view of a stainless steel plate constituting the hot plate unit.

As shown in FIG. 1 and FIG. 3, the reflection member used is a plate-shaped circular stainless steel plate 4 having a reflection plane S1 of radiant heat. This stainless steel plate 4 is designed to have a diameter smaller than that of the opening of the casing 2 and the heater 3. At a center portion of the stainless steel plate 4, three pin insert holes 16 are formed at locations corresponding to the aforementioned pin insert holes 6. Moreover, the stainless steel plate 4 is also provided with pin insert holes 17 for inserting the terminal pins 12 and the dummy pins 13. When assembling the apparatus, the terminal pins 12 are inserted into a sleeve 18 and then inserted into the pin insert holes 17 of the stainless steel plate 4. The sleeve 18 is made from a ceramic material (alumina and the like) having heat resistance and insulation characteristic so as to function to prevent contact between the terminal pins 12 and the stainless steel plate 4.

The stainless steel plate 4 has a radiant heat reflection plane S1 at least on one side thereof. The reflection plane is referred to as a surface where radiant heat from a predetermined direction is reflected unlike the absorption/transparency surface. Especially in the first embodiment, the stainless steel plate 4 used has such a reflection plane S1 on both sides thereof.

The stainless steel plate 4 is arranged between the casing 2 and the heater 3 with a predetermined space distance L between the back surface of the heater 3 and the stainless steel plate 4 and in parallel to the casing 2 and the heater 3. The predetermined space distance L1 is preferably 3 mm to 20 mm, and more preferably 5 mm to 10 mm. In the first embodiment, the space distance L1 is set at 8.5 mm.

The reflection plane S1 is arranged so as to face the back surface of the heater 3 because of a reason as follows. The thermal energy loss is reduced by reflecting the radiant heat from the heater 3 and returning back the heat to the heater 3. In the first embodiment, since the reflection plane S1 is provided on both sides, this condition is satisfied. It should be noted that a predetermined space distance is assured between the bottom portion 2a of the casing 2 and the stainless steel plate 4.

A spacer (not shown) made from heat-resistant ceramics may be provided between the upper surface of the stainless steel plate 4 and the back surface of the heater 3. When such a spacer is provided, it is possible to maintain the stainless steel plate 4 and the heater 3 in parallel to each other while maintaining the space distance L1. Such a spacer is preferably attached to the stainless steel plate 4 and to the heater 3 using a heat-resistant adhesive.

Next, explanation will be given on an example of a procedure for producing the hot plate unit 1.

A mixture is prepared by adding a sintering-promoting agent such as yttria and binder, if necessary, to a carbide or nitride ceramics powder. This mixture is uniformly kneaded by using a three-roll mill and the like. The resulting kneaded mixture is formed into an unprocessed molded product having a sheet shape and approximately square shape (so-called green sheet) by using a doctor blade apparatus. The sheet may also be formed by using the press forming method as follows. That is, the aforementioned mixture is formed into particles by using the spray drying method and the particles obtained are placed into a metal mold so as to be pressed, thereby forming an unprocessed molded product having a sheet shape and approximately square shape. More specifically, in the first embodiment, sheet molding was performed using as a material a kneaded mixture comprising 100 parts by weight of aluminum nitride powder (average particle diameter: 1.1 $\mu$m), 4 parts by weight of yttria (yttrium oxide having an average particle diameter of 4 $\mu$m), 12 parts by weight of acrylic binder, and alcohol.

After preparing the necessary number of the unprocessed molded products as layers, punching or drilling is performed to form holes for forming through holes and the pin insert holes 11. Furthermore, a conductive paste prepared in advance is printed to fill the through-hole-forming holes so as to form through holes at predetermined positions. After this, the conductive paste is printed onto the unprocessed molded product by the screen printing method so as to obtain a predetermined pattern. Then, the conductive paste forms the heat generating wiring layer 10. Next, it is preferable that the conductive paste be dried to remove the solvent and binder contained in the paste. More specifically, in the first embodiment, the conductive paste was used for forming the heat generating wiring layer that contains tungsten.

Next, a plurality of the unprocessed molded products following the printing step are layered, dried, pre-sintered, and complete-sintered at a predetermined temperature for a predetermined period of time. Thus, the unprocessed molded products and the conductive paste are sintered simultaneously and completely. As a result, it is possible to obtain the ceramic plate-shaped member 9 having the heat generating wiring layer 10 arranged as an inner layer thereof. The sintering step is preferably performed by using an HIP apparatus. When nitride ceramics or carbide ceramics are used, the temperature is preferably set in a range from approximately 1500 to 2500° C. More specifically, in the first embodiment using the nitride aluminum unprocessed molded products, the HIP was performed at a temperature of 1800° C. and under a pressure of 230 kg/cm$^2$ and a sintered member (plate-shaped member 9) having a thickness of 3 mm was obtained.

Subsequently, the plate-shaped member 9 is cut into a circular shape of a predetermined diameter (230 mm$\phi$ in the first embodiment) and subjected to a surface grinding process using a buff polishing apparatus or the like. Then, the pins 12 and 13 are soldered onto the land of the through holes 14. This completes the heater 3.

The pins 12 and 13 of the heater 3 are inserted into the pin insert holes 17 of the stainless steel plate 4 which has been prepared in advance. The terminal pins 12 are further inserted into a sleeve 18 and in this state, the lead line 8 is soldered to the tip ends of the respective terminal pins 12. The heater 3 having the stainless steel plate 4 on the back thereof is mounted on the opening 5 of the casing 2. This completes assembling of the hot plate unit 1.

Next, explanation will be given on a method and results of a performance test of the hot plate unit 1.

Figure 4:
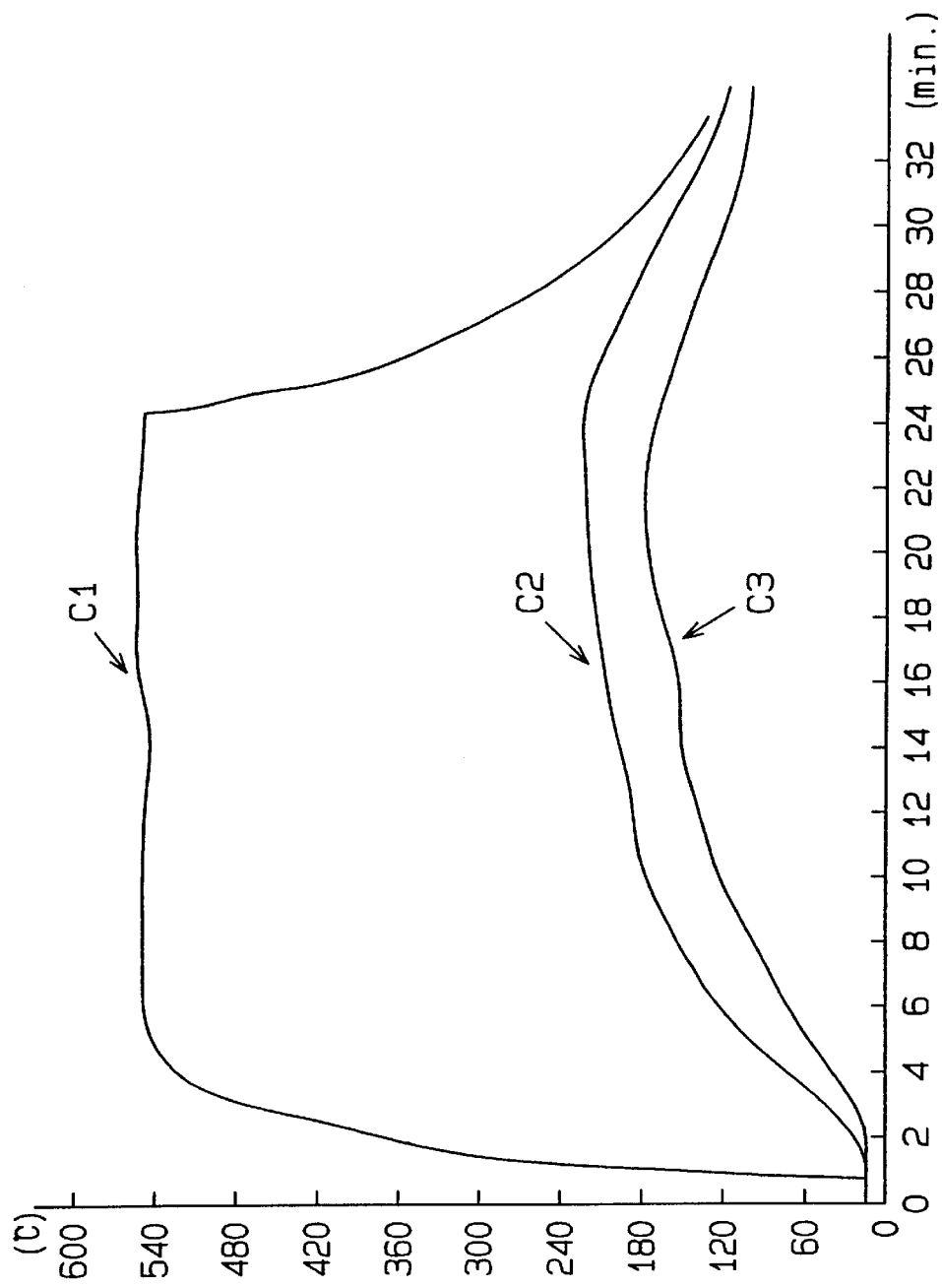
FIG. 4 is a graph showing a result of a performance test.
Figure 5:
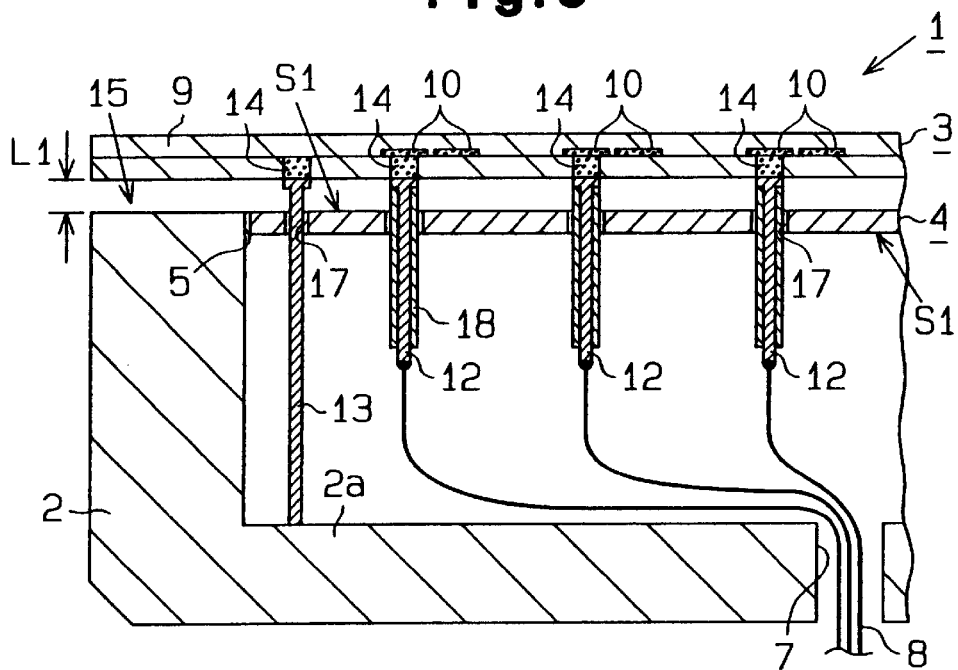
FIG. 5 is a partial sectional view of the hot plate unit.

In this performance test, temperature increase and decrease characteristics are checked during heating of the heater 3. For this performance test, a thermocouple of the heater side is arranged at the center portion of the front surface of the heater 3 and a thermocouple of the reflection member is arranged at the center portion of the back surface of the stainless steel plate 4, and their temperatures are respectively measured at a predetermined time interval. It should be noted that electric current is applied to the heater 3 for 24 minutes and after this, heating of the heater 3 is stopped for natural cooling. The heater 3 is set at approximately 550° C., at which a hold time is set to 20 minutes. FIG. 4 shows the test results.

In FIG. 4, the vertical axis represents the temperature (°C.) and the horizontal axis represents time lapse (minute). A curve C1 shows temperature change of the front surface of the heater 3 while a curve C2 shows temperature change of the back surface of the stainless steel plate 4.

When current application to the heater 3 is started, the front surface of the heater 3 is abruptly increased and reaches almost the set temperature of 550° C. in 4 or 5 minutes. The temperature of the heater 3 is almost constant for 24 minutes after heating start. On the other hand, temperature of the back surface of the stainless steel plate 4 increases comparatively slowly and reaches only 120 or 130° C. when 5 minutes have passed after the heating start. This temperature is suppressed to as low as approximately 230° C. even when 24 minutes have passed after the heating start. Accordingly, the temperature difference between C1 and C2 is as large as 320° C. When current application to the heater 3 is stopped, the temperature of the front surface of the heater 3 starts to lower and returns to the normal temperature after time lapse of about 15 minutes. The back surface temperature of the stainless steel plate 4 is also lowered likewise. Thus, in the first embodiment, a series of steps is completed for about 40 minutes in total.

Moreover, a curve C3 in FIG. 3 shows a temperature change of a back surface of an alumina plate replacing the stainless steel plate 4. Since the alumina has a low thermal conductivity as compared to the stainless steel, temperature increase of the back surface is suppressed.

Moreover, temperature distribution (difference between a highest temperature and a lowest temperature) of the heating surface when the hot plate unit using the alumina reflection plate heated to 600° C. was measured by using a thermoviewer (IR162012-0012) produced by Japan Datum Co., Ltd. The temperature difference was 7° C. In the case of the hot plate unit using the stainless steel reflection plate, the temperature difference was 10° C. Both of them showed preferable values. The difference in the temperature distribution caused by difference of the material used is considered to be caused by distortion of the reflection plate under a high temperature. The distorted reflection plate functions as a concave mirror to concentrate heat or as a convex mirror to disperse the heat. Accordingly, it is considered that the uniform temperature distribution can be obtained when using ceramics which are less susceptible to distortion.

The aforementioned results show that even the temperature of the back surface of the stainless steel plate 4 can be suppressed to about 230° C., which means that the casing 2 can be suppressed to a further lower temperature. This proves the effectiveness of the stainless steel plate 4.

Effects of the first embodiment will be detailed below.

(a) In the first embodiment, the stainless steel plate 4 having the reflection plane S1 is arranged between the casing 2 and the heater 3 with a predetermined space distance L1 from the heater 3. Accordingly, the radiant heat from the heater 3 is reflected by the reflection plane S1 of the stainless steel plate 4 and is returned to the heater 3. This substantially reduces the thermal energy loss from the heater 3. That is, the thermal energy loss is significantly reduced. Consequently, it is possible to effectively increase the temperature of the heater 3 as compared to a conventional apparatus having no reflection member.

On the contrary, when the stainless steel plate 4 is used, the radiant heat amount reaching the casing 2 is assured to be reduced, which enables prevention of an excessive temperature increase of the casing 2. Moreover, since the stainless steel plate 4 is not in direct contact with the heater 3, it is also possible to prevent temperature increase of the stainless steel plate 4 caused by the heat conduction.

As has been described above, in the first embodiment, it is possible to realize the hot plate unit 1 having a heater whose temperature can be increased in a short period of time. This reduces a predetermined time required for the entire wafer drying step, thereby improving the semiconductor productivity. Moreover, it is possible to prevent temperature increase of the casing 2 exceeding the temperature resistance of the metal material of the casing 2.

(b) In the first embodiment using the stainless teal plate 4, it is possible to obtain the reflection function. Accordingly, there is no need of arranging a heat-insulting material between the heater 3 and the casing 2 for preventing radiant heat. Accordingly, no dusts are generated. This enables obtaining of the hot plate unit 1 suitably used in the semiconductor production field which requires a highly clean environment.

(c) The heater 3 of the first embodiment uses the plate-shaped member 9 in the form of a disc made from nitride ceramics having an excellent heat resistance, a smaller thermal expansion coefficient than metals, and a high thermal conductivity. Accordingly, the heater 3 can have a small thickness and light weight and exhibits an excellent temperature control characteristic.

It should be noted that the present invention is not limited to the aforementioned embodiment but can be modified to other embodiments as follows.

Figure 6:
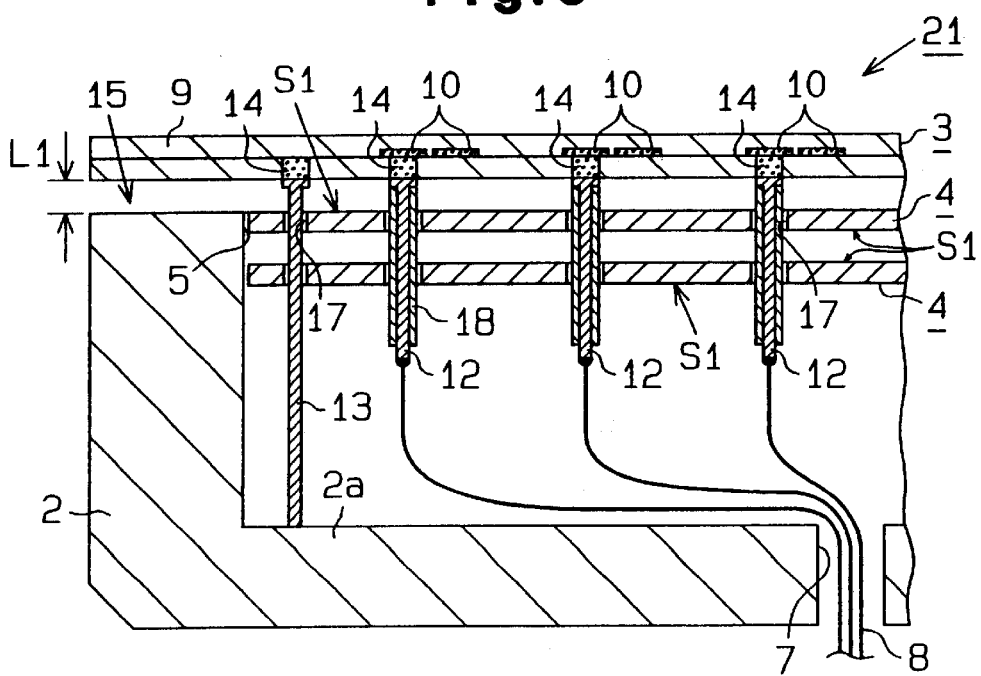
FIG. 6 is a partial sectional view of another example of the hot plate unit.

As shown in FIG. 6, a hot plate unit 21 according to another embodiment may have a plurality of (two in FIG. 6) stainless steel plates 4 serving as the plate-shaped reflection member. In this case, it is possible to improve radiant heat shielding action and to reduce the heater temperature increase time.

Instead of the stainless steel plate 4 of the first embodiment, it is possible to use a metal plate made from at least one selected from a group consisting of a copper plate, a nickel plate, an aluminum plate, and an iron plate; at least one ceramic plate selected from a group consisting of oxide ceramics, carbide ceramics, and nitride ceramics; and at least one resin selected from a group consisting of polyimide resin, epoxy resin, and fluorine resin. These can also be used in combination with the others.

As the oxide ceramics, it is possible to use at least one selected from a group consisting of alumina, silica, cordierite, and mullite. As the carbide ceramics, it is possible to use at least one selected from a group consisting of silicon carbide, titanium carbide, molybdenum carbide, tungsten carbide, and the like. As the nitride ceramics, it is possible to use at least one selected from a group consisting of aluminum nitride, silicon nitride, and titanium nitride.

Resin and ceramics have thermal conductivity lower than metals and heat absorption amount smaller than metals. Accordingly, in such a reflection plate, the temperature of the back surface of the reflection plate is not easily increased as compared to a reflection plate made from a metal.

Moreover, resin and ceramics are basically thermal insulators. Accordingly, it is possible to fix the lead line connected to a heat generating circuit and a line leading from the thermocouple (temperature measuring element) to the reflection plate. In this case, it is possible to prevent short-circuit due to contact between a lead line with another lead line.

In the hot plate unit using the resin plate, if the thermocouple is unintentionally removed and it becomes impossible to control the heat generation, the resin plate is burnt down. This cuts off the lead line connecting the power source to the heat generation member, thereby preventing further heat generation. That is, this resin plate functions as a thermostat.

Since the ceramic reflection plate is not distorted by heat, in the hot plate unit using the ceramic reflection plate, it is possible to prevent local concentration or dispersion of heat caused by distortion of the reflection plate. Accordingly, the hot plate unit having the ceramic reflection plate exhibits an excellent temperature uniformity on the heating surface.

Figure 7:
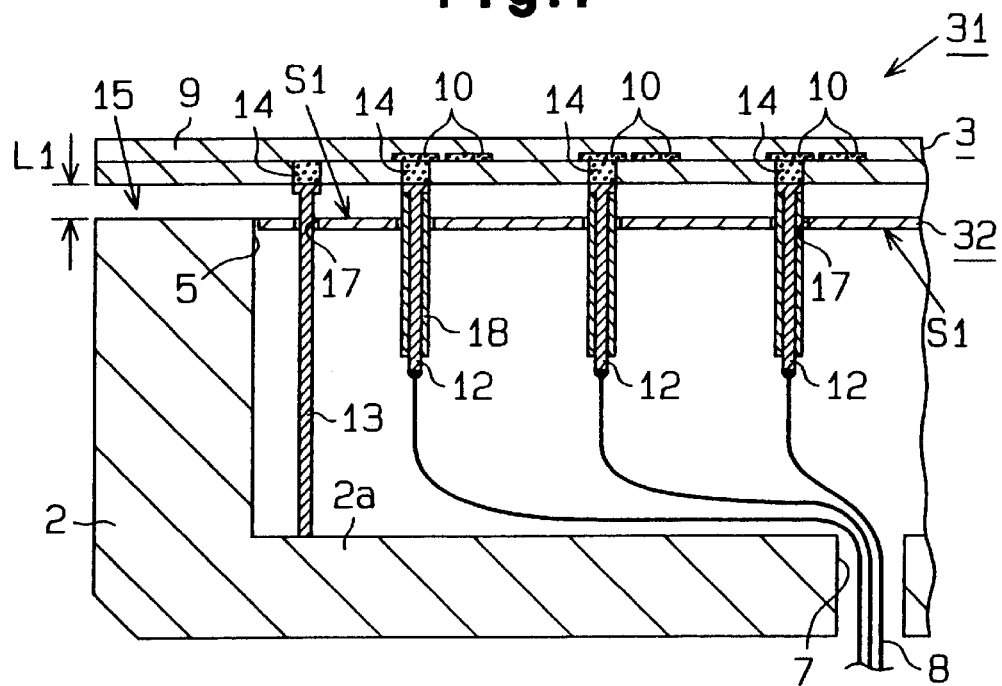
FIG. 7 is a partial sectional view of still another example of the hot plate unit.

FIG. 7 shows another example of the hot plate unit 31, in which the reflection member is made from a metal material in the form of foil such as an aluminum foil 32. In this case also, the reflection plane S1 should be formed on at least one side of the aluminum foil 32. The metal foil may be other than aluminum, such as metal foil made from gold, silver, nickel, and the like. It should be noted that it is also possible to use the plate-shaped reflection member of the first embodiment in combination with the foil-shaped reflection member of FIG. 7.

Figure 8:
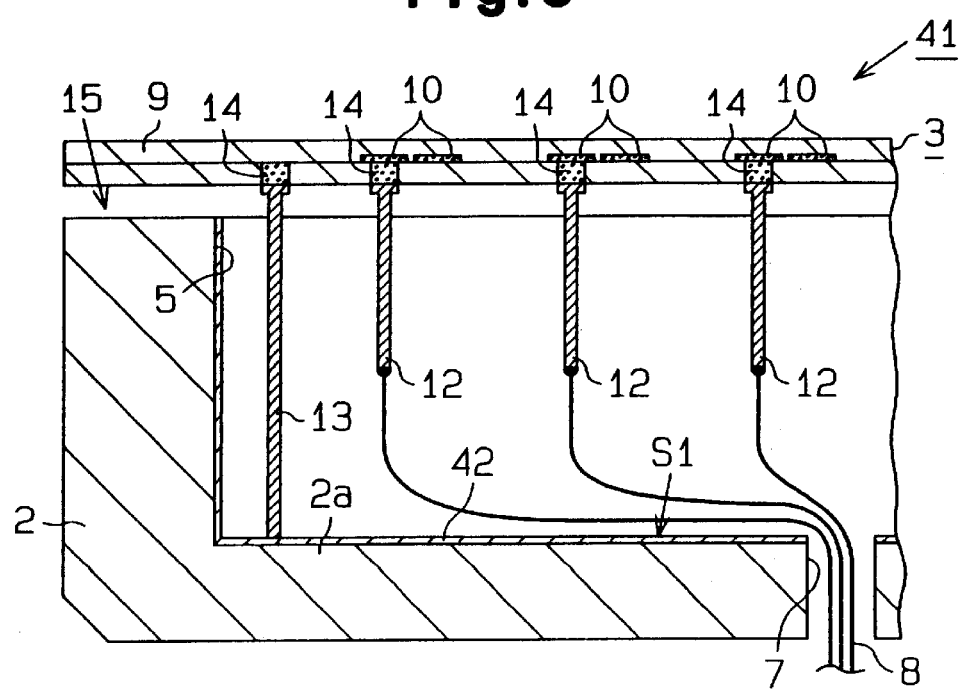
FIG. 8 is a partial sectional view of a further example of the hot plate unit.

FIG. 8 shows still another example of the hot plate unit 41, in which the reflection member is made from a layered material such as a copper-plated layer 42. The plated layer 42 may be formed on the inner wall of the casing 2. The plated layer 42 may be formed from a metal other than copper such as gold, platinum, silver, aluminum, chromium, nickel, cobalt, and the like. In this case, the plated layer should have a surface roughness in a range facilitating the reflection plane S1. As for the radiant heat shielding action, however, the reflection member of the first embodiment and the example of FIG. 7 have better characteristic because the reflection member is arranged apart from the casing 2.

The present invention is not limited to the heat generating wiring layer 10 buried between layers of the heater 3, i.e., a so-called high-temperature heater but can also be applied to a so-called low-temperature heater in which the heater 3 is burnt to be attached to the outer surface of the plate-shaped member 9. In this case, it is desired that the surface of the heat generating wiring layer 10 is coated with a metal layer so as to prevent oxidization.

What is claimed is:

1. A hot plate unit comprising:
   a) a casing having an opening portion and a bottom;
   b) a heater positioned on the opening portion, said heater including a plate-shaped member made from ceramics and a heat generating element positioned on the plate-shaped member; and
   c) a plate-shaped reflection assembly interposed between the casing and the heater and distanced from the bottom of the casing and the heater, whereby the assembly does not contact the heater.

2. The hot plate unit according to claim 1, wherein the plate-shaped reflection assembly is at least one selected from the group consisting of a metal plate, a ceramic plate and a resin plate.

3. The hot plate unit according to claim 1, wherein the ceramics are compounds selected from the group consisting of nitride ceramics and carbide ceramics.

4. The hot plate unit according to claim 1, wherein the plate-shaped reflection assembly is positioned parallel to a back surface of the heater.

5. The hot plate unit according to claim 4, wherein the plate-shaped reflection assembly comprises a plurality of plate-shaped members.

6. The hot plate unit according to claim 4, wherein the plate-shaped reflection assembly has at least two surfaces and said surfaces have reflection planes positioned thereon.

7. The hot plate unit according to claim 1, wherein the reflection assembly includes a foil reflection component.

8. The hot plate unit according to claim 1, wherein the plate-shaped member includes a plurality of plate-shaped components, and at least one heat generating element is interposed between at least one pair of plate-shaped components.

9. A hot plate unit comprising:
   a casing having an opening portion;
   a heater positioned on said opening portion and including a plate-shaped member made from ceramics and a heat generating element positioned on the plate-shaped member; and
   a plate-shaped reflection assembly interposed between the casing and the heater, wherein the casing and the heater are positioned at a distance from each other, whereby the assembly does not contact the heater.

10. The hot plate unit according to claim 9, wherein the plate-shaped reflection assembly is positioned parallel to a back surface of the heater.

11. The hot plate unit according to claim 9, wherein the plate-shaped reflection assembly is at least one selected from the group consisting of a metal plate, a ceramic plate and a resin plate.

12. The hot plate unit according to claim 9, wherein the ceramics are compounds selected from the group consisting of nitride ceramics and carbide ceramics.

13. The hot plate unit according to claim 9, wherein the plate-shaped reflection assembly comprises a plurality of plate-shaped members.

14. The hot plate unit according to claim 9, wherein the plate-shaped reflection assembly has at least two surfaces and said surfaces have reflection planes positioned thereon.

15. A hot plate unit comprising:
   a casing having an opening portion;
   a heater positioned on said opening portion and including a plate-shaped member made from ceramics and a heat generating element positioned on the plate-shaped member; and
   a plate-shaped reflection assembly interposed between the casing and the heater, wherein the heater has a plurality of terminal pins electrically connected to the heat generating element, and a plurality of dummy pins which are longer than the terminal pins and which are not electrically connected to the heat generating element.

16. The hot plate unit according to claim 15, wherein the heater comprises a heat-resisting and insulating sleeve which encases the terminal pins.

17. A hot plate unit comprising:
   a casing having an opening portion and a bottom;
   a heater positioned on the opening portion, said heater including a first plate-shaped member made from ceramics and a heat generating element positioned on the first plate-shaped member; and
   a second plate-shaped member interposed between the casing and the heater and distanced from the bottom of the casing and the heater, whereby the second plate-shaped member does not contact the heater.

18. The hot plate unit according to claim 17, wherein the second plate-shaped member is at least one selected from the group consisting of a metal plate, a ceramic plate, and a resin plate.

19. The hot plate unit according to claim 17, wherein the ceramics are compounds with at least one compound selected from the group consisting of nitride ceramics and carbide ceramics.

* * * * *